(12) United States Patent
Iizuka

(10) Patent No.: US 6,489,808 B2
(45) Date of Patent: Dec. 3, 2002

(54) BUFFER CIRCUIT CAPABLE OF CARRYING OUT INTERFACE WITH A HIGH SPEED

(75) Inventor: Yoichi Iizuka, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/155,976

(22) Filed: May 29, 2002

(65) Prior Publication Data

US 2002/0145445 A1 Oct. 10, 2002

Related U.S. Application Data

(62) Division of application No. 09/545,566, filed on Apr. 7, 2000.

(30) Foreign Application Priority Data

Apr. 8, 1999 (JP) .............................................. 11-101196

(51) Int. Cl.[7] ......................... H03K 19/00; H03K 19/02
(52) U.S. Cl. ........................... 326/56; 326/58; 327/112; 365/194
(58) Field of Search ............................. 326/56, 57, 58, 326/83, 86; 327/108, 111, 112, 389, 391; 365/194, 189.05, 189.08

(56) References Cited

U.S. PATENT DOCUMENTS

| | | | |
|---|---|---|---|
| 4,529,895 A | 7/1985 | Garverick | 307/473 |
| 4,933,579 A | 6/1990 | Isobe et al. | 307/592 |
| 4,983,860 A | 1/1991 | Yim et al. | 307/443 |
| 5,210,449 A | 5/1993 | Nishino et al. | 307/473 |
| 5,436,865 A | 7/1995 | Kitazawa | 365/194 |
| 5,654,648 A | 8/1997 | Mehekar | 326/17 |
| 6,201,743 B1 * | 3/2001 | Kuroki | 365/194 |

FOREIGN PATENT DOCUMENTS

| | | |
|---|---|---|
| EP | 0 481 698 | 4/1992 |
| JP | 63-112893 | 5/1988 |
| JP | 04-150224 | 5/1992 |
| JP | 04-245470 | 9/1992 |
| JP | 05-037321 | 2/1993 |
| JP | 7-105696 | 4/1995 |
| JP | 07-321633 | 12/1995 |
| JP | 236174 | 7/2002 |

OTHER PUBLICATIONS

Rhyne, Fundamentals of Digital Systems Design, 1973, NJ, pp. 70–71.

* cited by examiner

Primary Examiner—Daniel D. Chang
(74) Attorney, Agent, or Firm—Whitham, Curtis & Christofferson, P.C.

(57) ABSTRACT

A buffer circuit has a high-impedance function mode. The buffer circuit is for outputting a buffer output level. The buffer circuit comprises a buffer output control section for controlling the buffer output level to an opposite level in a moment before the buffer circuit becomes the high-impedance function mode. The opposite level is a level opposite to a present buffer output level.

3 Claims, 4 Drawing Sheets

| IN | EN | PG | NG | OUT |
|----|----|----|----|-----|
| A  | 1  | $\overline{A}$ | $\overline{A}$ | A |
| X  | 0  | 1  | 0  | Hiz |

BUFFER CIRCUIT CAPABLE OF CARRYING OUT INTERFACE WITH A HIGH SPEED

CROSS-REFERENCE TO RELATED APPLICATIONS

This application is a divisional application of U.S. Ser. No. 09/545,566 filed Apr. 7, 2000, and the complete contents of that application is herein incorporated by reference.

BACKGROUND OF THE INVENTION

This invention relates to a buffer circuit, and more particularly, to a buffer circuit capable of carrying out an interface with a high speed.

In general, a buffer circuit is known of which output electric potential has a tri-state which is represented by first through third states. In the first state, the output of the buffer circuit becomes a low (L) level. In the second state, the output of the buffer circuit becomes a high (H) level. In the third state, the output of the buffer circuit becomes a high impedance (Hiz). Such a buffer circuit may be called a tri-state buffer circuit.

In a first conventional tri-state buffer circuit, the output of the first conventional tri-state buffer circuit becomes the high impedance even if the input signal has a low or a high level. The state of the high impedance denotes the third state (tri-state) indicating that the output value is neither 1 nor 0. In other words, the buffer circuit is disconnected in the third state.

In a second conventional tri-state buffer circuit, the output of the second conventional tri-state buffer circuit becomes the high impedance even if the input signal has a high level.

However, it is difficult to transfer from one state to another state with a high speed as will be described later.

In order to improve the above-mentioned demerit, a first improved tri-state buffer circuit is disclosed in Japanese Patent Publication Tokkai Hei 7-321633 (321633/1995). In the first improved tri-state buffer circuit, it is possible to determine a potential level with a high speed and to reduce a consumption power when the output state becomes the high impedance.

In addition, a second improved tri-state buffer circuit is disclosed in Japanese Patent Publication Tokkai Hei 5-37321 (37321/1993). In the second improved tri-state buffer circuit, the potential level is set to an intermediate level by the movement of charges stored to a capacitance for a period of a potential except for the high impedance, when the output state becomes the high impedance.

Furthermore, a third improved tri-state buffer circuit is disclosed in Japanese Patent Publication Tokkai Syo 63-112893 (112893/1988). The third improved tri-state buffer circuit comprises an intermediate potential setting circuit. By the intermediate potential setting circuit, an intermediate potential is set without increasing a pass-through current.

Similarly, a fourth improved tri-state buffer circuit is disclosed in Japanese Patent Publication Tokkai Hei 4-245470 (245470/1992). In the fourth improved tri-state buffer circuit, the output state is driven to an opposite potential level once and the output state is thereafter set to the high impedance when the input state becomes a disabling state.

However, it is impossible to control the output state to only either one of the high and low levels in the first improved tri-state buffer circuit. In the second improved tri-state buffer circuit, it is difficult to design a capacitance in which charges are stored. In the third improved tri-state buffer circuit, an inverter of an output stage becomes short circuited and a consumption power is large. In the fourth improved tri-state buffer circuit, it is necessary to have a resistor for pull-up/pull-down. When the fourth improved tri-state buffer circuit is a semiconductor integrated circuit, it is difficult to provide the resistor on the semiconductor integrated circuit since a chip area increases, under the requirement that the integrated circuit be more miniaturized.

SUMMARY OF THE INVENTION

It is an object of this invention to provide a buffer circuit capable of carrying out interface with a high speed without restricting level control and without increasing consumption power.

It is another object of this invention to provide a buffer circuit capable of carrying out interface with a high speed without necessity of a difficult capacitance design and increase of a chip area.

Other objects of this invention will become clear as the description proceeds.

On describing a gist of this invention, it is possible to understand that a buffer circuit has a high-impedance function mode. The buffer circuit is for outputting a buffer output level.

According to this invention, the buffer circuit comprises buffer output control means for controlling the buffer output level to an opposite level in a moment before the buffer circuit becomes the high-impedance function mode. The opposite level is a level opposite to a present buffer output level.

DESCRIPTION OF THE PREFERRED EMBODIMENTS

Figures 1A, 1B:
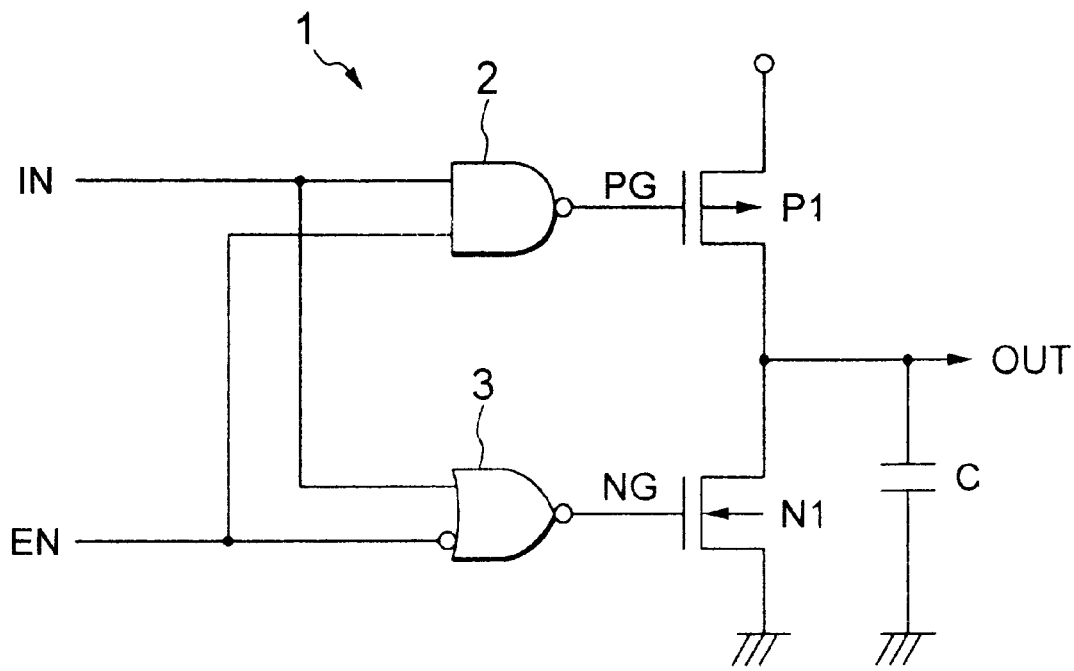
FIG. 1A is a circuit diagram of a first conventional buffer circuit.
FIG. 1B is an illustration of a corresponding relationship among signals.

Referring to FIGS. 1A and 1B, a first conventional buffer circuit will be described at first in order to facilitate an understanding of this invention. The buffer circuit 1 illustrated in FIG. 1A comprises an NAND gate 2, an NOR gate 3, a P-channel transistor P1, and an N-channel transistor N1.

In the buffer circuit 1, the gate of the P-channel transistor P1 is fixedly applied with a high level and the gate of the N-channel transistor N1 is fixedly applied with a low level when an enable signal EN has a low level. The output of the buffer circuit 1 becomes a high impedance (Hiz) even if the input signal any level such as high level or low level as shown in FIG. 1B. The state of the high impedance (Hiz) denotes a third state (tri-state) indicating that an output value is neither 1 nor 0. The buffer circuit 1 is in a state of a circuit disconnection.

Figure 2:
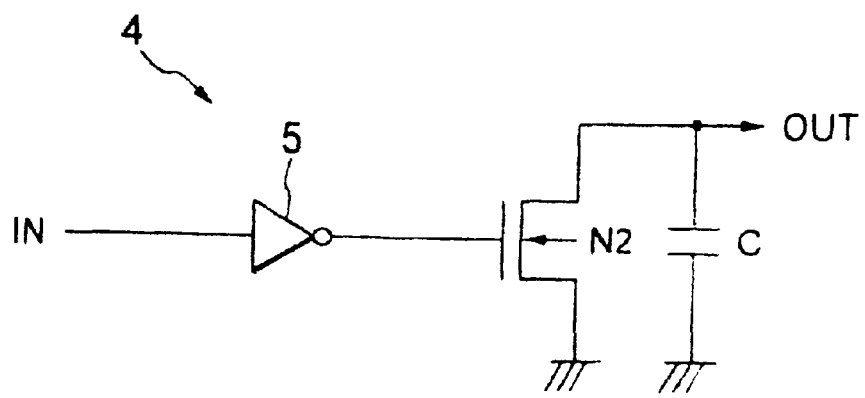
FIG. 2 is a circuit diagram of a second conventional buffer circuit.

Referring to FIG. 2, description will proceed to a second conventional buffer circuit which is an N-channel open drain buffer circuit. The buffer circuit 4 comprises an inverter 5 and an N-channel transistor N2. In the buffer circuit 4, the gate of the N-channel drive transistor N2 is supplied to the low level when the input signal IN has the high level. As a result, the output of the buffer circuit 1 becomes a high impedance (Hiz).

However, it is difficult to immediately transfer the output signal OUT after the high impedance (Hiz) is set, inasmuch as each of the buffer circuits 1 and 4 has a capacitance C. As a result, a previous level (potential) state may be maintained during a certain time duration. It takes the certain time duration to drive the potential level to the opposite level such as "from the high level to the low level" or "from the low level to the high level".

Inasmuch as the level is deviated to the previous state after the high impedance (Hiz) is set, it takes the certain time duration to charge the capacitance C in case where the opposite level is set in a next function. Inasmuch as it takes a long time to drive the potential level to the opposite level, it is difficult to carry out interface with a high speed in each of the buffer circuits 1 and 4.

Figure 3:
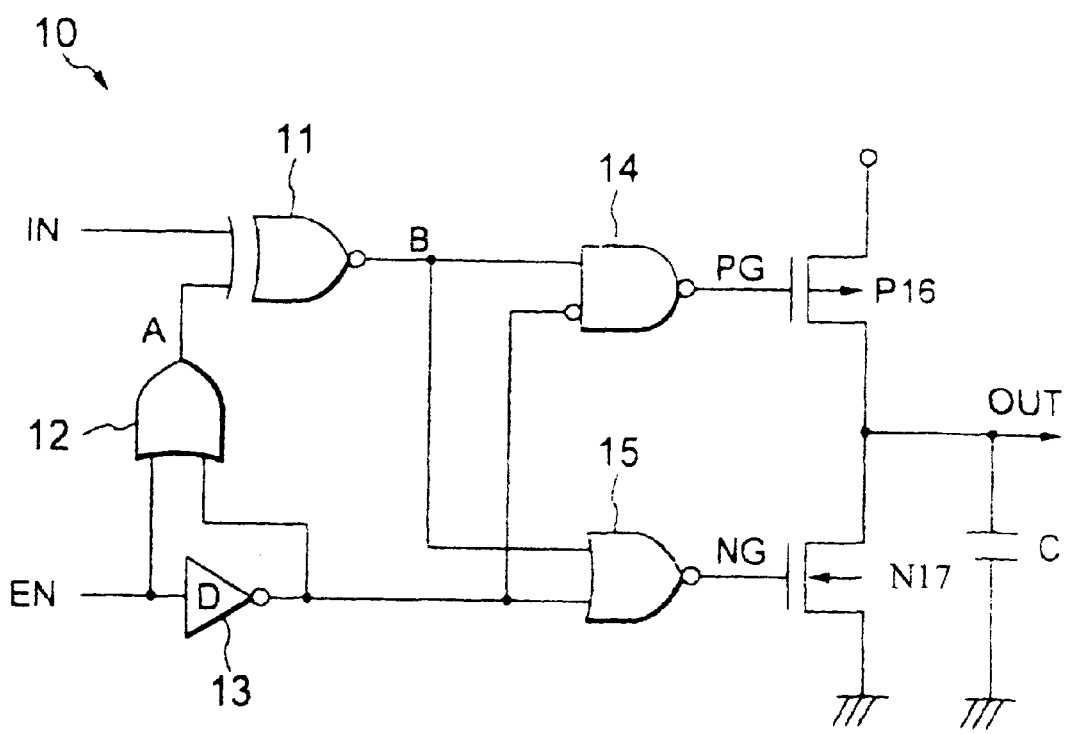
FIG. 3 is a block diagram of a buffer circuit according to a first embodiment of this invention.

Referring to FIG. 3, description will proceed to a buffer circuit according to a first embodiment of this invention. The buffer circuit 10 comprises an exclusive NOR (Ex.NOR) gate 11, an OR gate 12, an inverter 13, an NAND gate 14, an NOR gate 15, a P-channel transistor P16, and an N-channel transistor N17.

The Ex.NOR gate 11 is supplied with an input signal IN and an output signal of the OR gate 12. The OR gate 12 is supplied with an enable signal EN and an output signal of the inverter 13 which inverts the enable signal EN into an inverted signal. The NAND gate 14 is supplied with an output signal of the Ex.NOR gate 11. Furthermore, the NAND gate 14 is supplied with a signal into which the output signal of the inverter 13 is inverted. The NOR gate 15 is supplied with the output signal of the Ex.NOR gate 11 and the output signal of the inverter 13.

A gate electrode of the P-channel transistor P16 is supplied with an output signal of the NAND gate 14. A gate electrode of the N-channel transistor N17 is supplied with an output signal of the NOR gate 15. A source electrode of the P-channel transistor 16 is connected to a first power source. A source electrode of the N-channel transistor N17 is connected to a second power source (such as the GND). Connected to an output terminal are both of drain electrodes of the P-channel transistor P16 and N-channel transistor N17.

Figure 4:
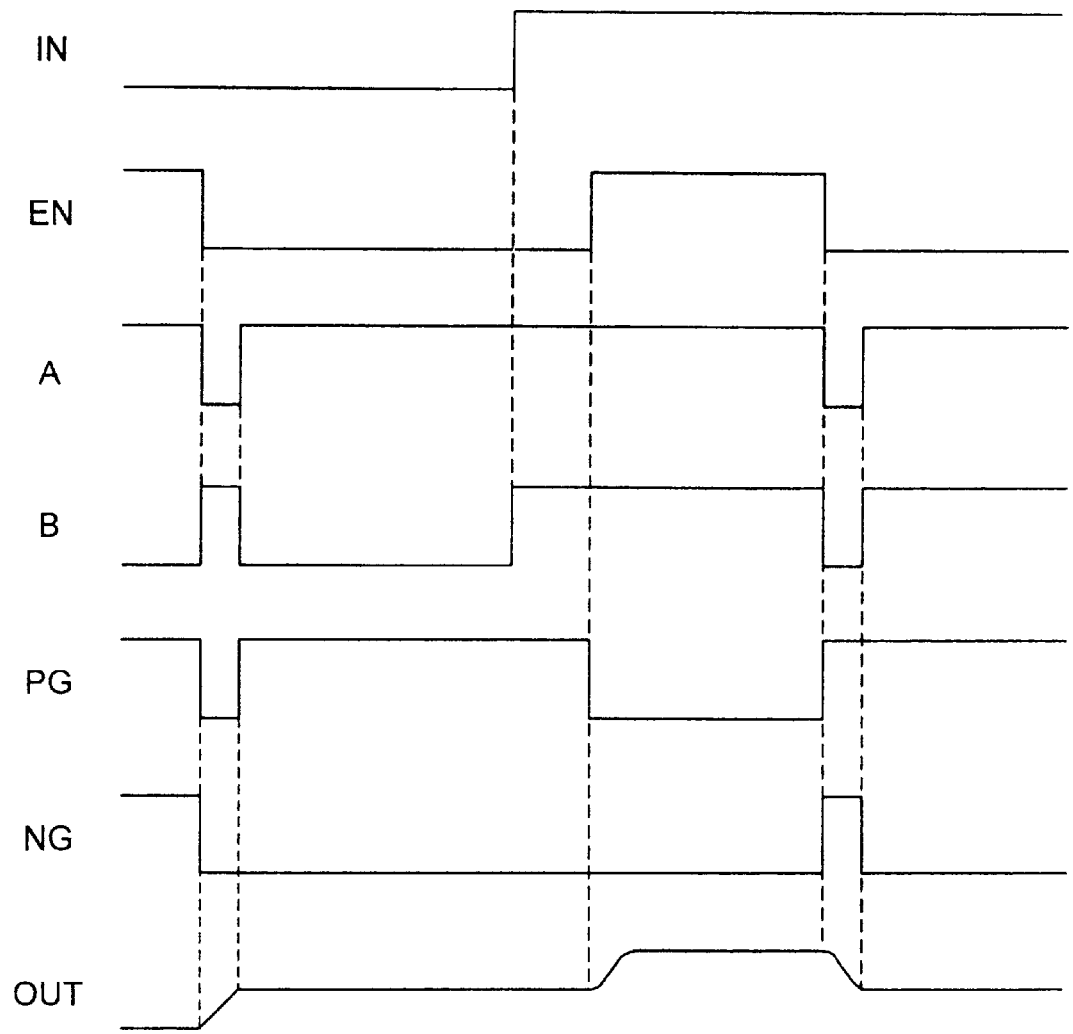
FIG. 4 is a timing chart for explaining a signal output operation of the buffer circuit illustrated in FIG. 3.

Referring to FIG. 3 in addition to FIG. 4, the OR gate 12 is supplied with a high level signal and a low level signal which outputted from the inverter 13, when the input signal IN has a low level and when the enable signal EN has a high level. As a result, the output A of the OR gate 12 becomes the high level.

Supplied with the low and the high level signals, the output B of the Ex.NOR gate 11 becomes the low level. The NAND gate 14 is supplied with the low level signal and the high level into which the output of the inverter 13 is inverted. Supplied with the low and the high level signals, the output PG of the NAND gate 14 becomes the high level which is supplied to the gate electrode of the P-channel transistor P16.

In addition, the output NG of the NOR gate 15 becomes the high level which is supplied to the gate electrodes of the N-channel transistor N17, when the output B of the Ex.NOR gate 11 has the low level and when the output of the inverter 13 has the low level.

As readily understood from the above description, the output signal OUT has the low level by the N-channel transistor N17 when the input signal IN has the low level and when the enable signal EN has the high level.

When the input signal IN continues to have the low level and when the enable signal EN varies from the high level to the low level, the OR gate 12 is supplied with the low level signal and the high level which is outputted from the inverter 13. Inasmuch as the inverter 13 has a delay, the OR gate is supplied with the low level signal and the low level signal which is the previous output of the inverter 13, in a moment. Therefore, the output A of the OR gate 12 becomes the low level in a moment.

Supplied with two low level signals, the output B of the Ex.NOR gate 11 becomes the high level. The NAND gate 14 is supplied with the high level signal and the high level signal into which the output of the inverter 13 is inverted. Supplied with two high level signals, the output PG of the NAND gate 14 becomes the low level which is supplied to the gate electrode of the P-channel transistor P16 in a moment.

In addition, the output NG of the NOR gate 15 becomes the low level which is supplied to the gate electrodes of the N-channel transistor N17, when the output B of the Ex.NOR gate 11 has the high level and when the output of the inverter 13 has the low level.

As readily understood from the above description the NAND gate 14 outputs an one-shot output of the low level inasmuch as the NAND gate 14 is driven to t he level (potential) opposite to the level at present in a moment, when the input signal IN continues to have the low level and when the enable signal EN varies from the high level to the low level.

In other words, the OR gate 12 having the inverter 13 functions as an one-shot pulse output control section for driving an potential to a potential opposite to a buffer output potential driven at present, in a moment before the OR gate 12 becomes a high-impedance function mode. The OR gate 12 outputs an one-shot pulse when the when enable signal EN becomes inactive.

After output delay in a moment, the OR gate 12 is supplied with the low level signal and the high level signal which is outputted from the inverter 13. As a result, the output A of the OR gate 12 becomes the high level.

Supplied with the low level signal and the high level signal, the output B of the Ex.NOR gate 11 becomes the low level. The NAND gate 14 is supplied with the low level signal and the low level signal into which the output of the inverter 13 is inverted. Supplied with two low level signals, the output PG of the NAND gate 14 becomes the high level which is supplied to the gate electrode of the P-channel transistor P16 in a moment.

In addition, the output NG of the NOR gate 15 becomes the low level which is supplied to the gate electrodes of the N-channel transistor N17, when the output B of the Ex.NOR gate 11 has the low level and when the output of the inverter 13 has the high level.

Accordingly, the output of the buffer circuit 10 has a state of the high impedance (Hiz), after the output delay for a moment causes the potential to be driven to the level opposite to the level at present.

When the input signal IN becomes the high level and when the enable signal EN continues to have the low level, the output A of the OR gate 12 continues to have the high level, while the output B of the EX.NOR gate 11 becomes the high level. The output PG of the NAND gate 14 continues to have the high level which is supplied to the gate electrode of the P-channel transistor P16. The output NG of the NOR gate 15 becomes the low level which is supplied to the gate electrode of the N-channel transistor N17.

When the input signal IN has the high level and when the enable signal EN varies from the low level to the high level, the output A of the OR gate 12 continues to have the high level. The output B of the Ex.NOR gate 11 continues to have the high level. Therefore, the output PG of the NAND gate 14 becomes the low level which is supplied to the gate electrode of the P-channel transistor P16. The output NG of the NOR gate 15 continues to have the low level which is supplied to the gate electrode of the N-channel transistor N17.

As a result, the output signal OUT becomes the high level by the P-channel transistor P16 when the input signal IN has the high level and when the enable signal EN varies from the low level to the high level.

When the input signal IN has the high level and when the enable signal EN varies from the high level to the low level, the output A of the OR gate 12 becomes the low level and the output B of the Ex.NOR gate 11 becomes the low level in a moment inasmuch as the inverter 13 has the delay. The output PG of the NAND gate 14 becomes the high level which is supplied to the gate electrode of the P-channel transistor P16. The output NG of the NOR gate 15 becomes the high level in a moment that is supplied to the gate electrode of the N-channel transistor N17.

Consequently, a potential is driven to a level opposite to the level at present in a moment when the input signal IN continues to have the high level and when the enable signal EN varies from the high level to the low level.

After output delay for a moment, the output A of the OR gate 12 becomes the high level and the output B of the Ex.NOR gate 11 becomes the high level. The output PG of the NAND gate 14 continues to have the high level which is supplied to the gate electrode of the P-channel transistor P16. The output NG of the NOR gate 15 becomes the low level which is supplied to the gate electrode of the N-channel transistor N17.

As described above, the output of the buffer circuit 10 has the high impedance (Hiz) after the output delay for a moment causes a potential to be driven to a level opposite to the level at present. With respect to the output signal OUT, the level is increased by the one-shot output PG when the input signal IN has the low level. The level is decreased by the one-shot output NG when the input signal IN has the high level.

Figure 5:
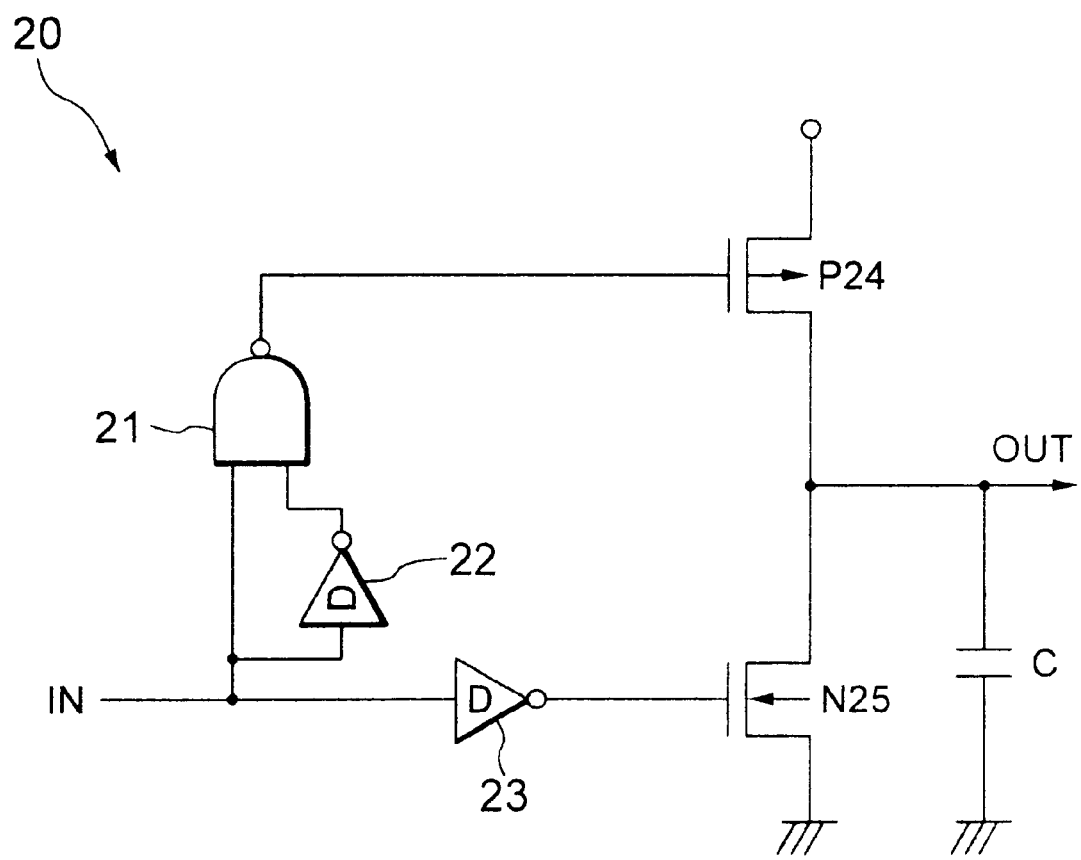
FIG. 5 is a block diagram of a buffer circuit according to a second embodiment of this invention.

Referring to FIG. 5, description will proceed to a buffer circuit according to a second embodiment of this invention. In FIG. 5, the buffer circuit 20 is an N-channel open drain buffer circuit. A drain load resistor is not connected to an N-channel open drain buffer circuit 20. The N-channel open drain buffer circuit 20 comprises an NAND gate 21, an inverter 22, an inverter 23, a P-channel transistor P24, and an N-channel transistor N25. The P-channel transistor P24 is a pull-up transistor for pulling up an output line of an open drain output circuit.

The NAND gate 21 is supplied with the input signal IN and the output signal of the inverter 22 to which the input signal IN is supplied. The input signal IN is supplied to the inverter 23. An output signal of the NAND gate 21 is supplied to a gate electrode of the P-channel transistor P24. An output signal of the inverter 23 is supplied to a gate electrode of the N-channel transistor N25.

A source electrode of the P-channel transistor P24 is connected to a first power source. A source electrode of the N-channel transistor N25 is connected to a second power source (such as the GND). Connected to an output terminal are both of drain electrodes of the P-channel transistor P24 and N-channel transistor N25.

In the N-channel drain buffer circuit 20, the inverter 22 functions in a similar manner as that of the inverter 13 of the tri-state buffer circuit 10 illustrated in FIG. 3.

As described in conjunction with FIG. 3, the OR gate outputs a signal of a spike waveform to the inverter 13 when the tri-state buffer circuit 10 operates so as to become the high impedance (Hiz). In other words, the OR gate outputs the signal of the spike waveform to the inverter 13 in case where the enable signal EN becomes the low level in the tri-state buffer circuit 10. The signal of the spike waveform is transmitted to the P-channel transistor P16 and the N-channel transistor N17. As a result, the output level (potential level) is driven to a level opposite to the level driven at present for a moment before the tri-state buffer circuit 10 becomes the high impedance (Hiz).

Similarly, the NAND gate 21 outputs a signal of a spike waveform to the inverter 22 in FIG. 5 when the N-channel open drain buffer circuit 20 operates so as to become the high impedance (Hiz). In other words, the NAND gate 21 outputs the signal of the spike waveform to the inverter 22 in FIG. 5 in case where input signal IN becomes the high level in the N-channel open drain buffer circuit 20. The signal of the spike waveform is transmitted to the P-channel transistor P24. As a result, the output level (potential level) is driven to a level opposite to the level driven at present for a moment before the N-channel open drain buffer circuit 20 becomes the high impedance (Hiz).

It is possible to adjust a driving time duration for opposite level on the basis of the delay of the inverter 13 or inverter 22. The driving time duration is changed in accordance with a capacitance C of an output stage and a level to be desired upon the high impedance (Hiz).

As described above, the output level (potential level) is driven to the level opposite to the level at present instantly when the output level becomes the high-impedance in the buffer circuit having the high-impedance state function mode such as the tri-state buffer circuit or N-channel open drain buffer circuit. As a result, the output level is forcedly returned from the present level to an intermediate potential level.

In other words, the output level is driven to the opposite potential by one shot for a moment, in order to return the output level to the intermediate potential. As a result, it is possible to reduce a time duration required for an output leading or a an output trailing. It is possible to carry out transmission with a high speed even if the output level of the buffer circuit becomes the low level or high level in a next operation.

As readily understood from the above description, the delay decreases in the high-impedance state function. It is possible to operate with the high speed. As a result, it is possible for the buffer circuit to carry out interface with the high speed in buses between semiconductor chips.

According to the buffer circuit of this invention, it is possible to control "pull-up" state or "pull-down" state. In other words, it is possible to control the high level or the low level. As a result, it is unnecessary to discharge the charges stored in the capacitance. The inverter of the output stage does not become a short-circuit state. Furthermore, it is unnecessary to have a pull-up/pull-down resistor. Thus, It is possible to operate with the high speed without regulation for level control, without increase in consumption power, without difficult capacitance design, and without the resistor which causes enlargement of the chip area.

It is possible for the tri-state buffer circuit 10 to operate with the high speed in the case where the output level is changed from the low level to the high impedance (Hiz) and in case where the output level is changed from the high level to the high impedance (Hiz). On the other hand, it is possible for the open drain buffer circuit 20 to operate with the high speed in case where the output level is changed to the low level to the high impedance (Hiz).

While this invention has thus far been described in conjunction with the preferred embodiments thereof, it will readily be possible for those skilled in the art to put this invention into practice in various other manners.

What is claimed is:

1. A buffer circuit having a high-impedance function mode, said buffer circuit for outputting a buffer output level, wherein said buffer circuit comprises:

buffer output control means for controlling said buffer output level to an opposite level in a moment before said buffer circuit becomes said high-impedance function mode, wherein said opposite level is a level opposite to a present buffer output level, said buffer circuit being a tri-state buffer circuit having an output stage means for outputting said buffer output level, wherein said buffer output control means controls said output stage means to make said output stage means produce a tri-state output as said buffer output level, wherein said buffer output control means makes said output stage means produce said tri-state output as said buffer output level on making an enable signal become inactive, wherein:

said buffer output control means outputs a buffer control signal in accordance with said enable signal;
   said buffer circuit further comprising:
      an exclusive NOR gate supplied with an input signal and said buffer control signal for producing an exclusive NOR signal;
      a NAND gate supplied with said exclusive NOR signal and a delayed signal for producing a NAND signal, said delayed signal being delayed from said enable signal during a predetermined delay time; and
      a NOR gate supplied with said exclusive NOR signal and an inverted signal for producing a NOR signal, said enable signal being inverted into said inverted signal having said predetermined delay time;
   said output stage means comprising:
      a P-channel transistor having a P-channel gate electrode supplied with said NAND signal, a P-channel source electrode connected to a first power source, and a P-channel drain electrode connected to a buffer circuit output terminal for outputting said buffer output level; and
      an N-channel transistor having an N-channel gate electrode supplied with said NOR signal, an N-channel source electrode connected to a second power source, and an N-channel drain electrode connected to said buffer circuit output terminal.

2. A buffer circuit as claimed in claim 1, wherein said buffer output control means comprises:
   an OR gate supplied with said enable signal and said inverted signal for producing an OR signal as said buffer control signal; and
   an inverter supplied with said enable signal for inverting said enable signal into said inverted signal.

3. A tri-state buffer circuit, comprising:
   an input signal line for supplying an input data;
   an enable signal line for supplying an enable signal;
   a one-shot circuit comprising an OR-gate having a first input receiving said enable signal and a second input receiving a delayed inverted enable signal;
   an exclusive-NOR gate having a first input receiving said input data and a second input receiving an output from said OR-gate of said one-shot circuit;
   a NAND-gate having a first input receiving an output from said exclusive-NOR gate and a second input receiving said delayed inverted enable signal;
   a NOR-gate having a first input receiving said output from said exclusive-NOR gate and a second input receiving said delayed inverted enable signal; and
   an output stage comprising a series connected PMOS transistor and an NMOS transistor, an output of said NAND-gate connected to a gate terminal of said PMOS transistor and an output of said NOR-gate connected to said NMOS transistor.

* * * * *